(12) United States Patent
Narula

(10) Patent No.: US 10,980,340 B1
(45) Date of Patent: Apr. 20, 2021

(54) TRAY FOR MEDIA DEVICE

(71) Applicant: Melissa Narula, Menlo Park, CA (US)

(72) Inventor: Melissa Narula, Menlo Park, CA (US)

( * ) Notice: Subject to any disclaimer, the term of this patent is extended or adjusted under 35 U.S.C. 154(b) by 0 days.

(21) Appl. No.: 16/984,504

(22) Filed: Aug. 4, 2020

(51) Int. Cl.
*A47B 23/00* (2006.01)
*H05K 7/14* (2006.01)

(52) U.S. Cl.
CPC ............. *A47B 23/007* (2013.01); *H05K 7/14* (2013.01); *A47B 2023/008* (2013.01)

(58) Field of Classification Search
CPC ... A47B 23/007; A47B 2023/008; H05K 7/14
See application file for complete search history.

(56) References Cited

U.S. PATENT DOCUMENTS

| | | | | |
|---|---|---|---|---|
| 2,823,489 A * | 2/1958 | Laing | ................... | A47B 23/007 248/445 |
| 2,896,364 A * | 7/1959 | McCollister | ......... | A47B 23/007 248/445 |
| 4,867,407 A * | 9/1989 | Becker | ................. | A47B 23/007 248/444.1 |
| 5,112,021 A * | 5/1992 | Greene | ................ | A47B 23/007 248/444.1 |
| 5,259,581 A * | 11/1993 | Goldberg | ............. | A47B 23/007 248/444.1 |
| 5,485,980 A * | 1/1996 | Luccia | ................. | A47B 23/007 248/444.1 |
| 5,624,096 A * | 4/1997 | Haynes | ................ | A47B 23/042 248/451 |
| 5,913,502 A * | 6/1999 | Smith | ................... | A47B 23/007 248/223.41 |
| 6,637,714 B1 * | 10/2003 | Hall | ...................... | A47B 23/007 248/444.1 |
| 7,117,621 B2 * | 10/2006 | Chang | ................... | A47G 1/0616 40/738 |
| 9,084,041 B2 * | 7/2015 | Tsai | ......................... | H04R 1/02 |
| 9,274,556 B2 * | 3/2016 | Gallouzi | .............. | F16M 11/105 |
| 9,737,136 B1 * | 8/2017 | Toland | ................. | F16M 13/027 |
| 2015/0173465 A1 * | 6/2015 | Messner | ............... | G06F 3/0395 248/205.4 |
| 2015/0184791 A1 * | 7/2015 | Chow | ................ | F16M 11/2021 248/124.2 |
| 2016/0192774 A1 * | 7/2016 | Hwang | .................. | A47B 23/04 248/445 |
| 2017/0360200 A1 * | 12/2017 | Cohen | .................... | F16M 11/22 |

* cited by examiner

*Primary Examiner* — Anita M King
(74) *Attorney, Agent, or Firm* — Raubvogel Law Office

(57) ABSTRACT

A tray holds a media device in a substantially facedown position. The tray may have a transparent bottom surface or a window, permitting content on the media device to be viewed from below, through the transparent surface or window. The tray may optionally be angled, at a fixed or adjustable angle, for optimal orientation during viewing. The tray may be secured to a wall, cabinet, table, or other surface or object, either in a fixed or adjustable position. The tray may include a lip around its edges, to ensure that the media device does not slide off during normal operation. Optionally, additional mechanisms can be provided to further secure the media device within the tray; these can include, for example, elastic strap(s), hook-and-loop fastener(s), adhesive fastener(s), magnet(s), tension clip(s), spring(s), a lid, and/or the like. The tray may also include cutouts to enable access to features of the media device.

34 Claims, 14 Drawing Sheets

TRAY FOR MEDIA DEVICE

TECHNICAL FIELD

The present document relates to an apparatus and method for holding a media device in a viewable position.

BACKGROUND

Keeping a baby entertained during diaper changing time is a uniquely difficult challenge. Typically, the person changing the diaper needs two hands to perform the task properly, and does not have a free hand to restrain the baby or to make sure the baby does not fall off the changing table. Straps designed to restrain the baby may be cumbersome, uncomfortable, and difficult to use. Usually, the person changing the diaper simply needs the baby to be entertained so that the baby lies still for a few moments, making the diaper changing process quicker, safer, and easier for all.

One way to entertain a baby is to provide engaging, child-friendly audiovisual entertainment, as may be displayed on a smartphone, tablet, or other device. However, since the person changing the diaper does not typically have a free hand, it is necessary for such a media device to be held in some secure manner during the diaper changing process. Handing the device to the baby is a risky approach, since the baby may throw, damage, or attempt to eat the device.

Ideally, the device needs to be within view of the baby, while also being out of reach so that the baby cannot grab the device and potentially damage it. However, existing device holders, clips, and similar apparatuses are not well adapted to this unique situation. In general, such device holders provide ways to secure the device in a vehicle, on a desk, or in some other situation where the device is intended to be viewable and easy to reach. Such device holders are therefore not well-suited for entertaining a baby. In addition, many such device holders require some effort to secure the device to the holder, making it difficult for a person changing a diaper to quickly and effectively place the media device it an appropriate position for viewing by the baby. Further, such device holders are not designed to carefully consider the viewing angle of the phone relative to the process of inserting the device. Finally, many device holders require that the media device be fitted with a specialized case, magnet, or other apparatus.

SUMMARY

The present disclosure describes an improved tray for a media device, which addresses the limitations of other device holders. The tray is transparent, so that the media device can be placed face down within the tray and viewed from below. In at least one embodiment, the transparent tray may be angled for optimal orientation during viewing; such angle may be fixed (for example, at 45 degrees), or it may be adjustable (either by providing a number of available angle settings, or by providing continuous angle adjustment).

In at least one embodiment, the tray may be secured to a wall, cabinet, table, or other sturdy surface or object. In various embodiments, the tray may have a fixed position in relation to the surface or object to which it is attached. Alternatively, the position of the tray may be adjustable, for example by providing a flexible "gooseneck" connector, hinged and/or rotatable arm, swing arm, or other known mechanism that allows for positional adjustment.

In at least one embodiment, the tray includes a flat surface on which the media device can rest, surrounded by a lip that is sufficiently high to ensure that the media device does not slide off the tray during normal operation. In at least one embodiment, the lip can be of uniform height on all sides. Alternatively, if the tray is angled, the downward edge can have a higher lip than do the other edges, for added security. In at least one embodiment, the tray may include features to make removal of the device easier, such as a cutout allowing a user to insert a finger or thumb to easily push the device up and out of the tray. In at least one embodiment, the tray may include an opening and/or cutout to allow for charging of the device while in the tray.

In operation, the user can simply place the media device facedown onto the transparent tray, so that the display screen of the device is flush against the surface of the tray. The baby (or any other individual) can view the display screen through the transparent tray, without having to hold or touch the media device. The media device is therefore kept safe from the baby, who might otherwise damage the device if it were placed within his or her reach.

One advantage of the described apparatus is the ease with which the media device can be placed into the tray or removed from the tray. There is no need for the media device to be clipped, attached, or otherwise secured to the tray or to any other surface. Rather, the media device can be held in place by simply resting against the surface of the tray, while the edges of the tray ensure that the media device does not fall off the tray. Optionally, additional mechanisms can be provided to further secure the media device within the tray; these can include, for example, elastic strap(s), restraining bar(s), hook-and-loop fastener(s), adhesive fastener(s), magnet(s), tension clip(s), spring(s), and/or the like.

In various embodiments, the tray can be sized to hold any type of media device (or other device), such as a smartphone, tablet, toy, game, laptop, music player, and/or the like. In at least one embodiment, the tray can be sized so that it can hold a variety of different media devices. Any securing mechanisms, if included, can be made adjustable so that they can work with different sizes of media devices.

In at least one embodiment, the tray can be constructed of clear plastic or any other transparent material. Alternately, the sides of the tray can be constructed of a non-transparent material, such as wood, metal, or non-transparent plastic, while the tray surface itself can be constructed of a transparent material. In at least one embodiment, the corners of the tray can be rounded so as to reduce the risk of injury.

Further advantages and variations are described herein.

BRIEF DESCRIPTION OF THE DRAWINGS

The accompanying drawings illustrate several embodiments. Together with the description, they serve to explain the principles of the embodiments. One skilled in the art will recognize that the particular embodiments illustrated in the drawings are merely exemplary, and are not intended to limit scope.

DETAILED DESCRIPTION

In at least one embodiment, the described tray holds a media device in a facedown position, with the display screen of the media device oriented downwards. The surface of the tray is transparent, allowing the display screen of the media device to be viewed from below. In at least one embodiment, the media device can be held in place by gravity, and can be kept from falling out of the trap by a lip surrounding the edges of the tray. Optionally, a strap, magnet, or other fastener can be provided to further secure the tray. As described in more detail herein, the tray can be attached to a wall or other stable surface using any appropriate fastening means, which may be fixed or adjustable.

In various embodiments, the tray described herein can be used to hold any suitable type of media device having a display screen. Examples of such media devices include, but are not limited to, smartphones, tablets, games, toys, display screens, laptops, music players, and/or the like. For illustrative purposes, the tray is described herein in connection with an embodiment suited to holding a smartphone.

Apparatus

Figure 1:
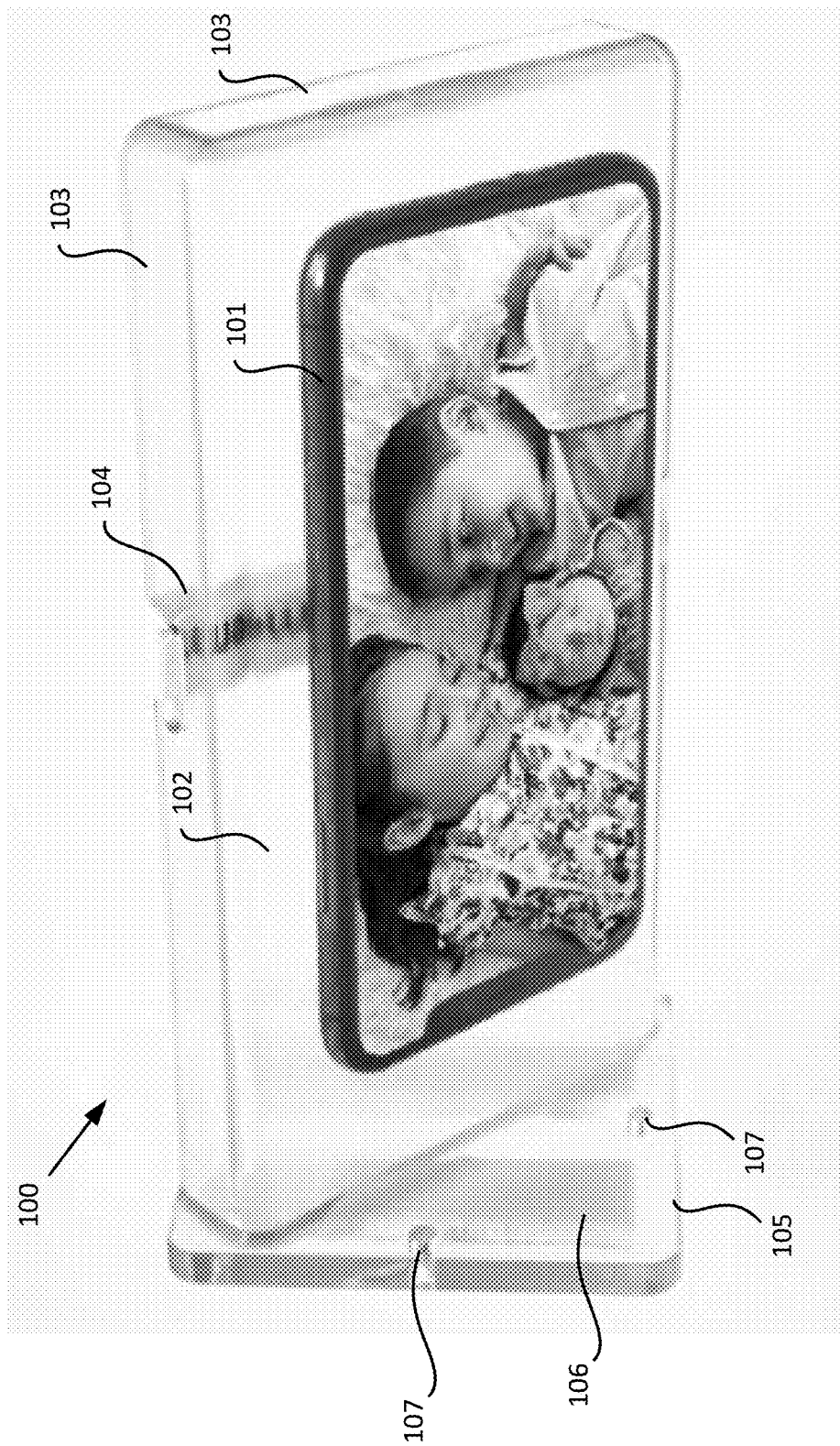
FIG. 1 is a perspective view of a tray for a media device, viewed from below, according to one embodiment.
Figure 2:
FIG. 2 is another perspective view of the tray, viewed from above, according to one embodiment.

Referring to FIG. 1, there is shown a perspective view of tray 100, viewed from below, according to one embodiment. Referring also to FIG. 2, there is shown another perspective view of tray 100, viewed from above, according to one embodiment. For illustrative purposes, in FIGS. 1 and 2, tray 100 is shown holding media device 101, which in this case is a smartphone. In the depicted embodiment, tray 100 is of a size that is large enough to easily insert and remove media device 101, while also allowing for use with devices of other sizes. Referring also to FIG. 2, there is shown an example wherein tray 100 may have adjustable size, for example by providing components 901A, 901B that can be slid or moved with respect to one another, thereby changing the overall size of tray 100.

As depicted, surface 102 of tray 100 is constructed of transparent material (in this case transparent plastic), so that the display screen of media device 101 can be easily viewed from below. In other embodiments, surface 102 made be constructed of other transparent materials; alternatively, whether or not surface 102 is transparent, a window can be provided in surface 102 to allow for viewing of the display screen of media device 101 from below.

The depicted tray 100 allows an individual to view content presented on the display screen of device 101 while looking up from below. For example, a baby can easily view a movie, show, animation, video, book, or other content on media device 101 while the baby's diaper is being changed. Tray 100 may also be used to hold device 101 in other situations where it may be convenient for content to be viewed from below, such as when an individual is resting face up in bed. Tray 100 may also be used to hold device 101 in other situations as well, such as while on the toilet when the viewer may not touch device 101, or in any situation where device 101 is being used as an auxiliary screen, such as to provide another screen to watch media or to engage in videoconferencing.

In operation, tray 100 protects device 101 from damage while content is being presented on device 101. Since device 101 is placed face down in tray 100, the display screen of device 101 is protected from splatters and spills that may make their way toward device 101. Thus, tray 100 may be useful in situations where liquids and/or other harmful materials might otherwise make contact with the surface of the display screen of device 101 (for example, while cooking or conducting work involving mixing ingredients).

In at least one embodiment, as shown, tray 100 is tilted, so that device 101, when held by tray 100, is positioned at an angle for improved viewing. In various embodiments, the angle at which tray 100 is tilted may be adjustable, either by providing a plurality of positions for orienting tray 100 at a number of different angles, or by providing a continuous angle adjustment. Alternatively, the angle of tray 100 may be fixed.

In at least one embodiment, tray 100 includes lip 103 that helps prevent device 101 from sliding or falling. Such lip 103 may be particularly useful when tray 100 is tilted, but it may also be included in embodiments where tray 100 is horizontally oriented, so as to reduce the possibility of device 101 falling off tray 100 if it is bumped or otherwise disturbed. Lip 103 may be provided on all edges or on any suitable subset of the edges of tray 100 (for example, for a tilted tray 100, lip 103 may be provided on the lower edge of tray 100). In at least one embodiment, as described in more detail below, lip 103 may include one or more cutout portion(s) for inserting a finger or thumb to help push device 101 up and out of tray 100. In at least one embodiment, lip 103 may be adjustable to allow the user to cover or expose such cutout portion(s) as desired.

Figure 6:
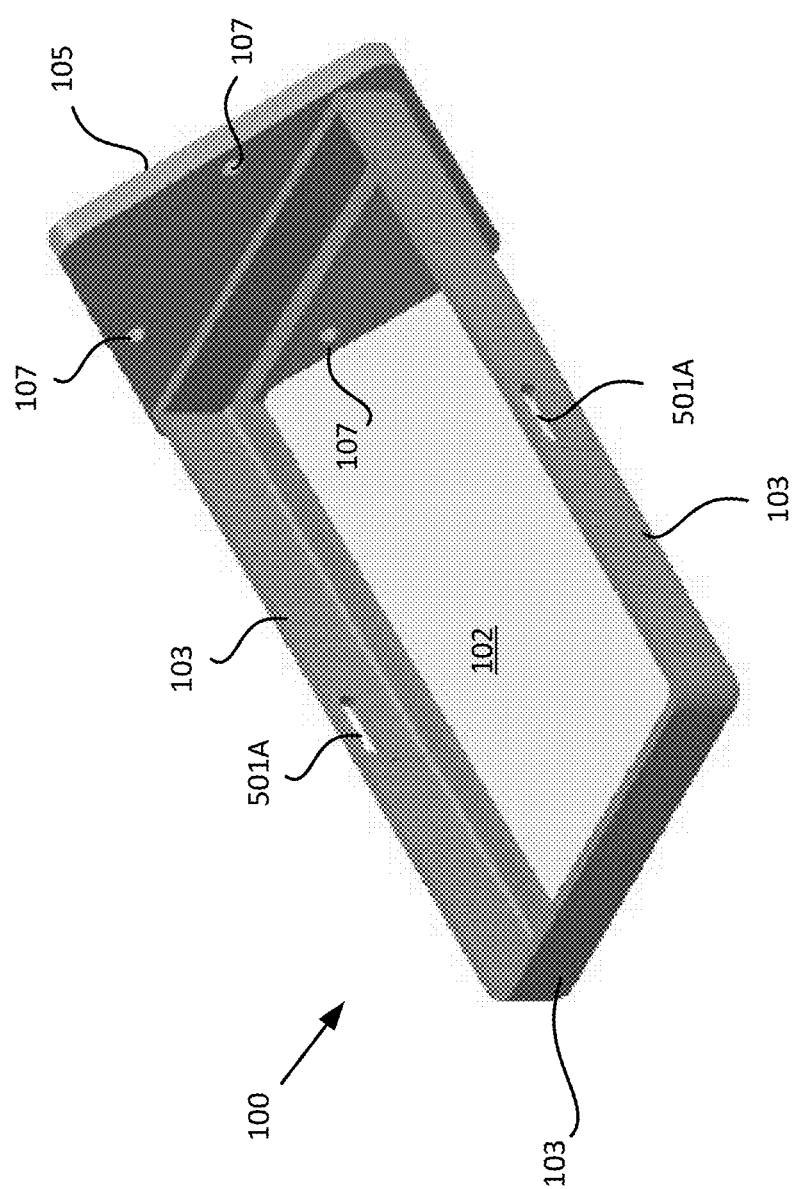
FIG. 6 is a perspective view of a tray for a media device, wherein the lip and plate are constructed from wood, and the surface through which the media device is to be viewed is constructed from transparent plastic.

In at least one embodiment, lip 103 may be constructed from the same material as surface 102 and other portions of tray 100; alternatively, lip 103 may be constructed from a different material than surface 102 and other portions of tray 100. Referring now to FIG. 6, there is shown a perspective view of an example of tray 100 wherein lip 103 and plate 105 are constructed from wood, and surface 102 is constructed from transparent plastic. One skilled in the art will recognize that any suitable material can be used in place of wood and/or transparent plastic.

Returning to FIG. 1, in at least one embodiment, a restraining mechanism, such as strap 104, may be included to further secure device 101 on tray 100. Other examples of a restraining mechanism may be a magnet, a hook-and-loop fastener, an adhesive strip, and/or the like.

In at least one embodiment, tray 100 is attached to a wall, table, cabinet, desk, or other stable surface or object via plate 105. Any suitable mechanism can be used to attach plate 105 to the surface or object, such as for example adhesive strips 106, screws, nails, a clamping mechanism, a spring, a magnet, and/or the like. In the examples of FIGS. 1 and 2, plate 105 includes holes 107 to permit attachment to the surface or object by screws 108 (as shown in FIG. 2) or nails. The mechanism for attaching tray 100 to the surface or object can be permanent or removable. For example, in at least one embodiment, a bracket may be affixed to a wall or other surface or object. The bracket may removably attach to plate 105 or to tray 100 itself. The user can then easily remove plate 105 or tray 100 from the wall bracket when desired, and can even move tray 100 to a different location (for example to another bracket attached to another wall, surface, or other object).

Figure 12:
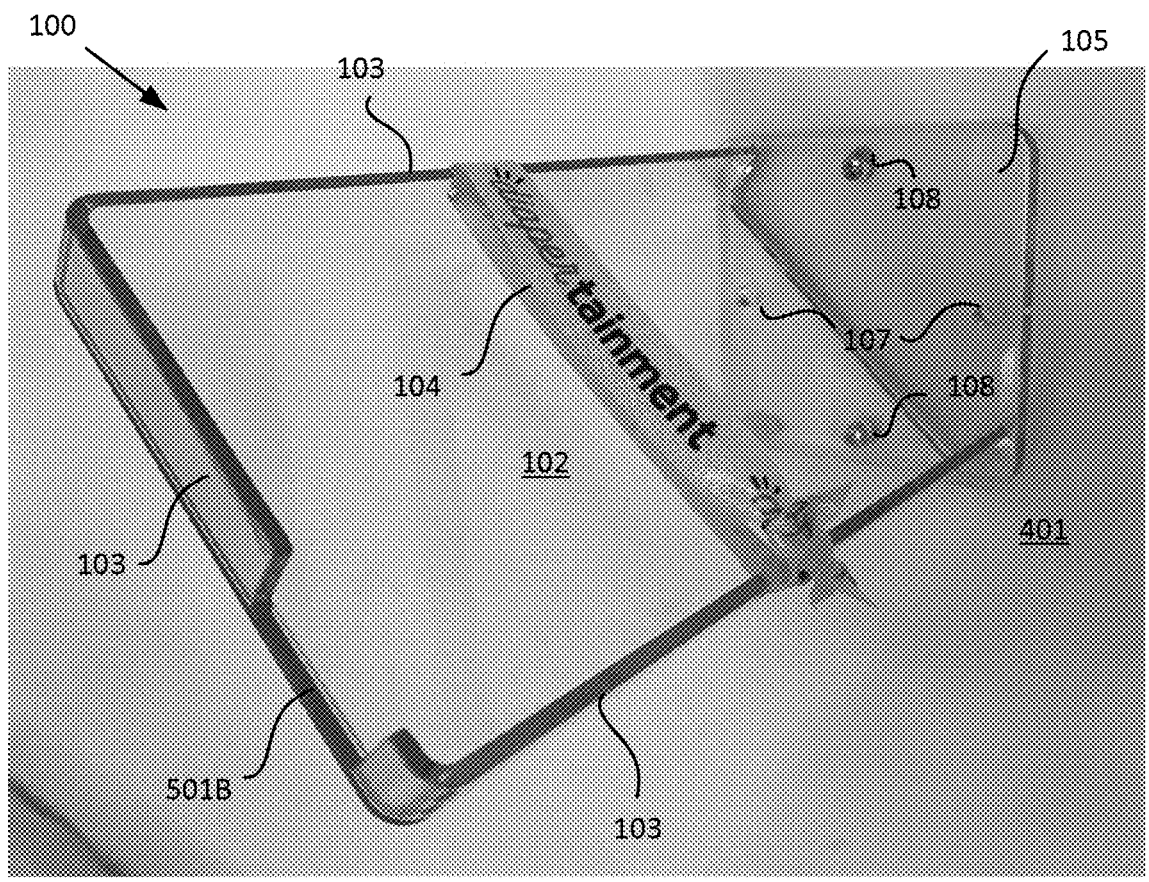
FIG. 12 is a perspective view of a tray having a plate attached to a supporting surface using screws, according to one embodiment.

Referring now to FIG. 12, there is shown a perspective view of tray 100 wherein screws 108 are used to attach plate 105 to wall 401, according to one embodiment.

Figure 3:
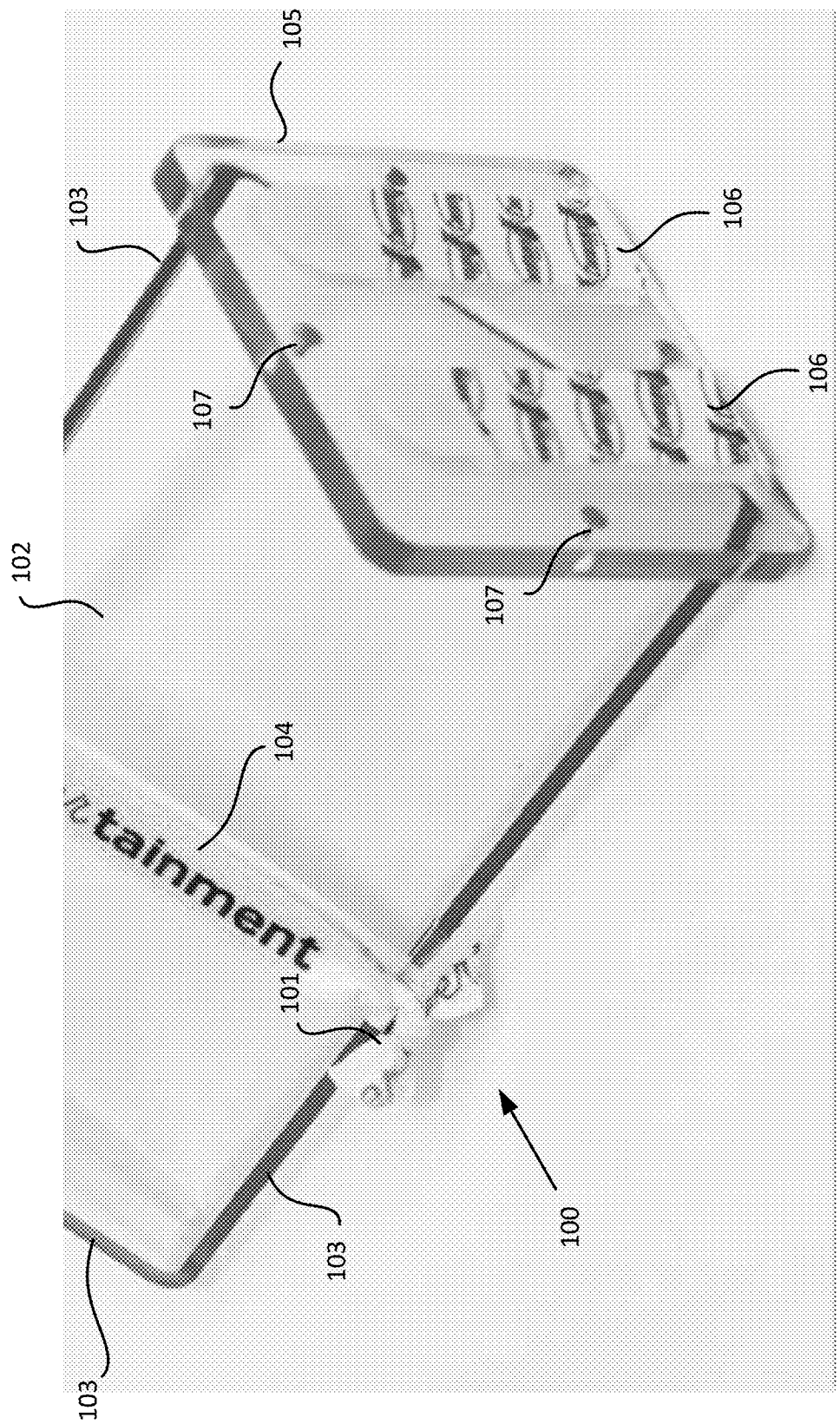
FIG. 3 is another perspective view of the tray, viewed from above, according to one embodiment.

Referring also to FIG. 3, there is shown another perspective view of tray 100, viewed from above, according to one embodiment. FIG. 3 depicts further details of plate 105, including adhesive strips 106 and holes 107.

Figure 4:
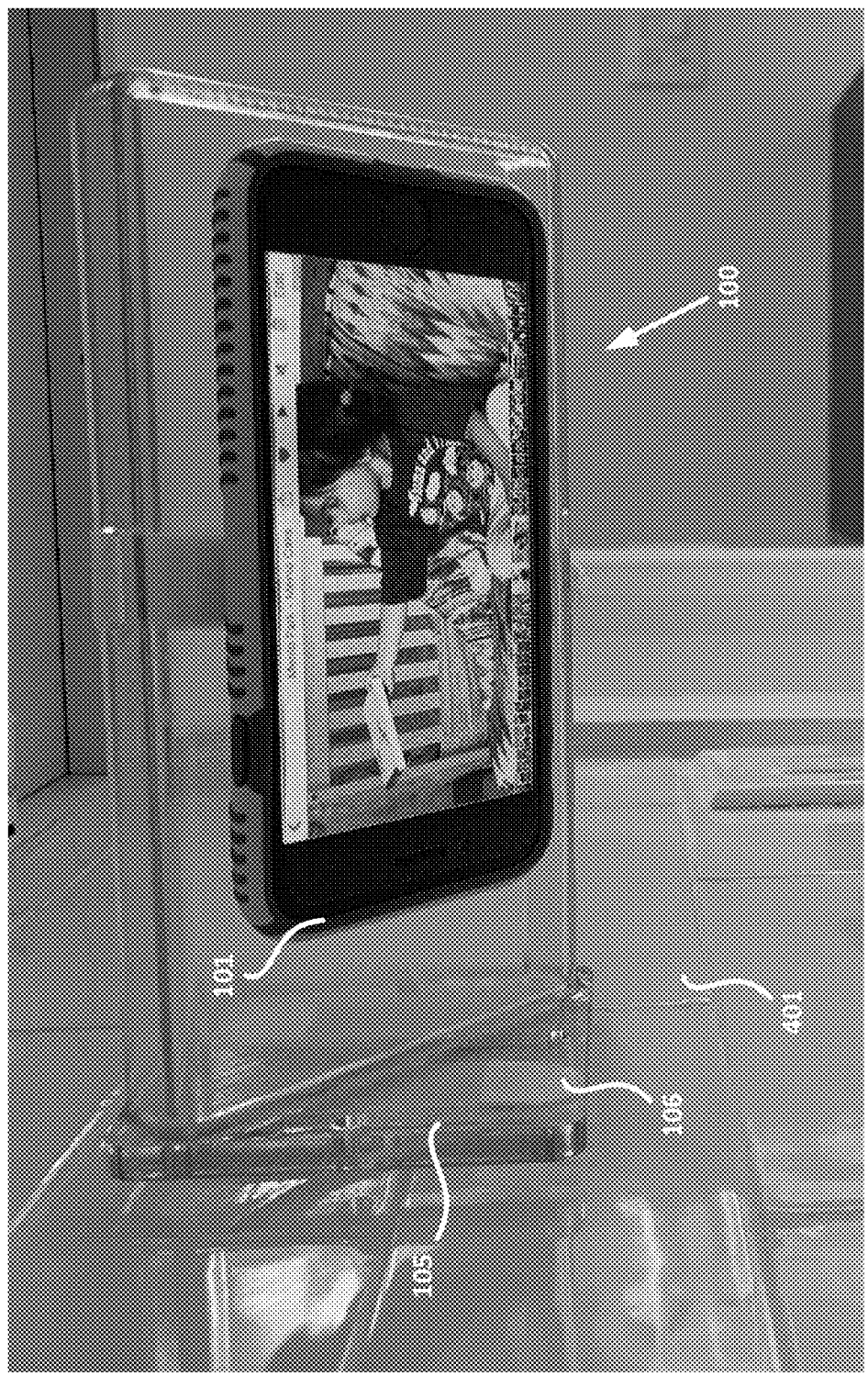
FIG. 4 is another perspective view of the tray affixed to a wall, viewed from below, according to one embodiment.

Referring also to FIG. 4, there is shown another perspective view of tray 100 in operation and affixed to wall 401.

In the depicted examples, tray 100 is attached to wall 401 in such a manner that the position of tray 100 is fixed. In other embodiments, however, the position of tray 100 may be adjustable, either by providing for adjustable positioning of plate 105 with respect to wall 401 or other surface, or by providing for adjustable positioning of tray 100 with respect to plate 105. For example, tray 100 may be attached to plate 105 by an adjustable connector such as a flexible "gooseneck" connector, hinged and/or rotatable arm, swing arm, and/or other known mechanism that allows for positional adjustment. Alternatively, plate 105 may be attached to wall 401 by some similar adjustable connector. In yet another embodiment, plate 105 may be omitted, and an adjustable connector can be used to affix tray 100 directly to wall 401.

In at least one embodiment, tray 100 may be attached to wall 401 (or another surface) via a retractable mechanism, such as a hinge or similar connector (not shown), arranged so that tray 100 can be retracted or positioned up parallel to wall 401 when not in use. Such retractable mechanism can be positioned between plate 105 and tray 100, or between plate 105 and wall 401.

In at least one embodiment, the retractable mechanism may be a telescoping connector or similar connector (not shown), arranged so that tray 100 can easily be pulled in and out to different viewing positions. Again, such telescoping connector or similar connector can be positioned between plate 105 and tray 100, or between plate 105 and wall 401.

Figure 5A:
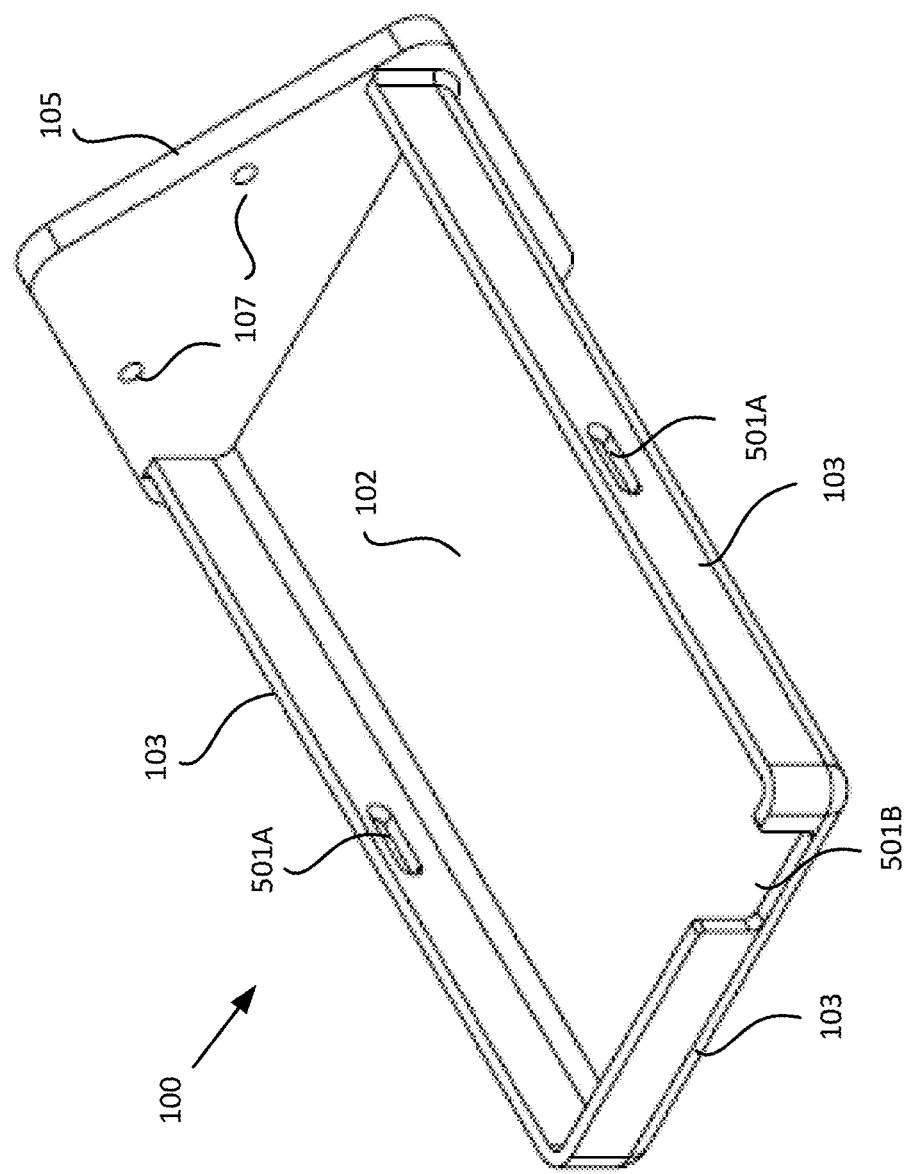
FIG. 5A is another perspective view of the tray, viewed from above, according to one embodiment.
Figure 5B:
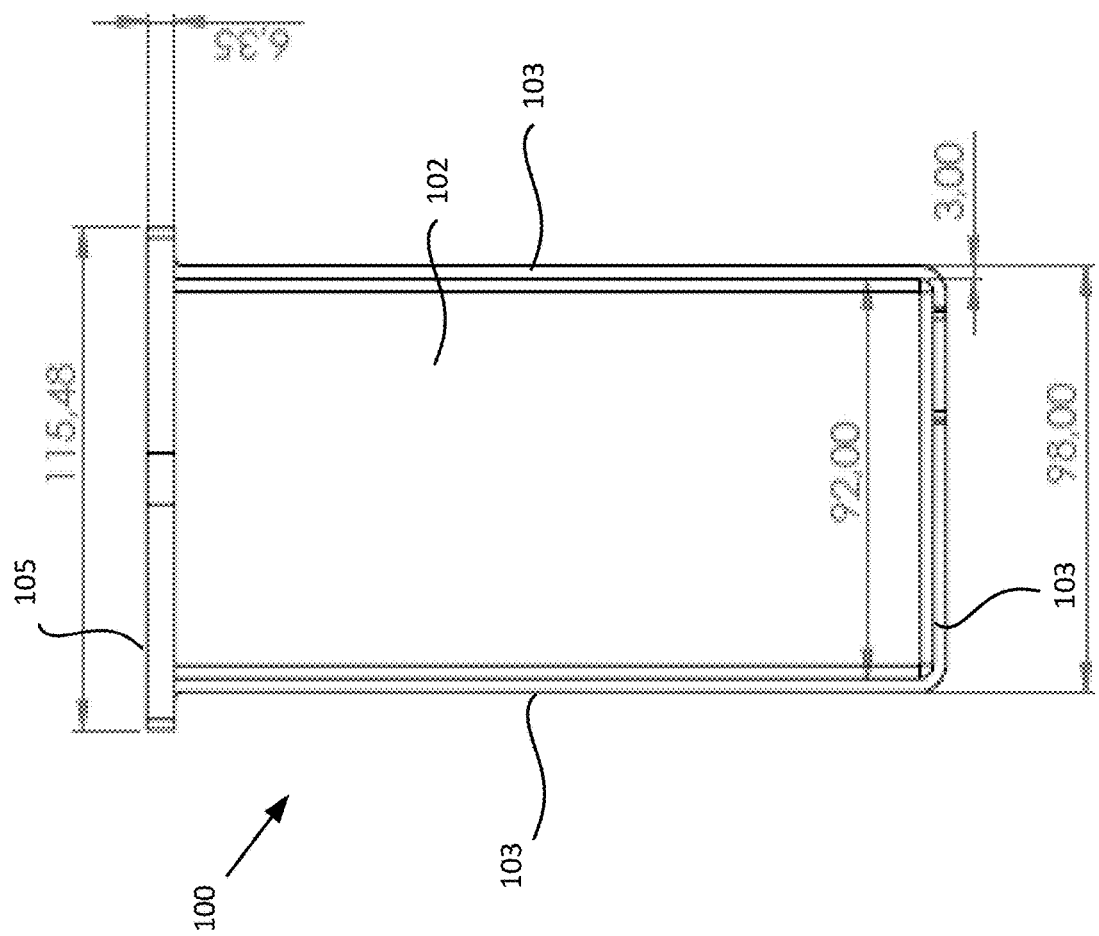
FIG. 5B is a top view of the tray, according to one embodiment.
Figure 5C:
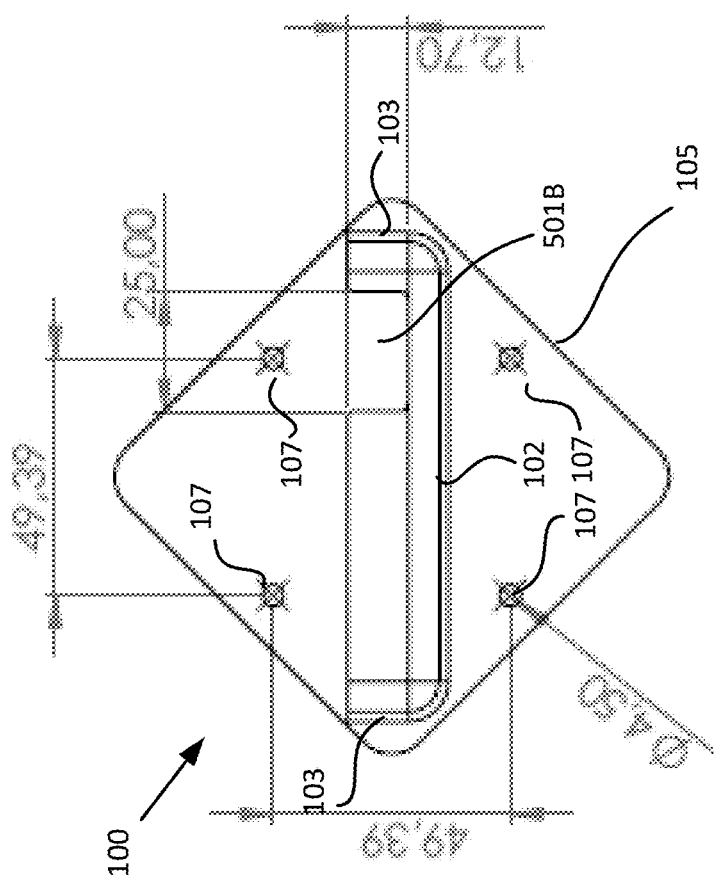
FIG. 5C is a front elevation view of the tray, according to one embodiment.
Figure 5D:
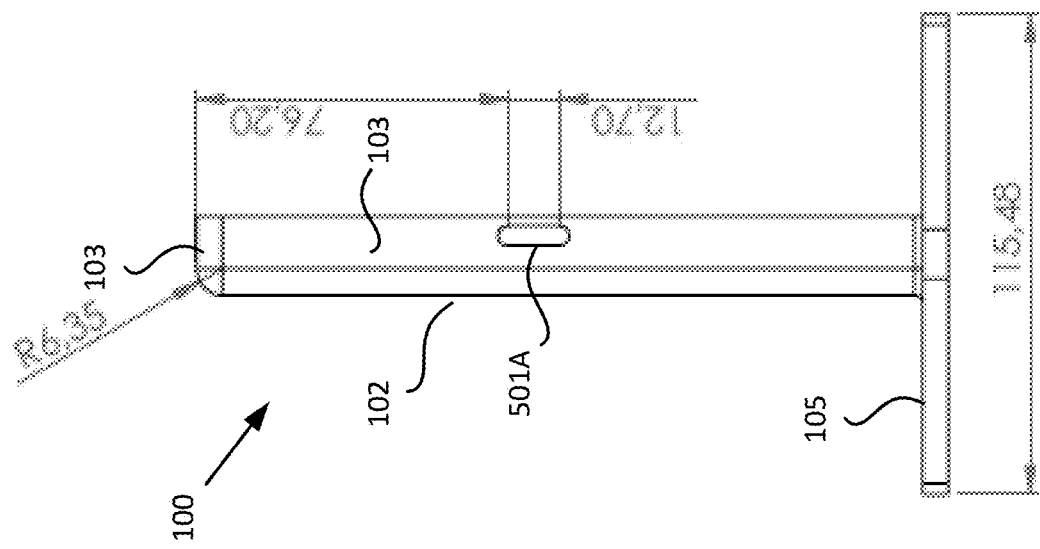
FIG. 5D is a side elevation view of the tray, according to one embodiment.

Referring now to FIG. 5A, there is shown an additional perspective view of tray 100. Referring also to FIG. 5B, there is shown a top view of tray 100, according to one embodiment. Referring also to FIG. 5C, there is shown a front elevation view of tray 100, according to one embodiment. Referring also to FIG. 5D, there is shown a side elevation view of tray 100, according to one embodiment.

In at least one embodiment, sufficient space surrounds device 101 while it is situated in tray 100 to allow the user to grasp device 101 by the edges. In at least one embodiment, as shown in FIGS. 5A through 5D, lip 103 may include one or more cutouts 501A to accommodate easier removal of the media device, or to accommodate access to buttons, switches, or other features of device 101. One or more additional cutouts 501B can be provided to enable the user to insert a thumb or finger and thereby more easily remove device 101 from tray 100. Any suitable number of such cutouts 501A, 501B may be provided. As shown, cutouts 501A, 501B may be fashioned as holes and/or notches in edge 103, as desired. Alternately, such cutouts may be made in surface 102 rather than (or instead of) in edge 103; if so, such cutouts may be positions so as to avoid significantly impeding the clarity of the media through surface 102.

Dimensions shown in FIGS. 5A through 5D are for illustrative purposes only.

Operation

In operation, a user places media device 101 in or on tray 100, face down so that the display screen of media device 101 is visible through transparent surface 102. The user can optionally secure media device 101 using strap 104 or other restraining mechanism. Before or after placing media device 101 in tray 100, the user initiates playback of content on media device 101, for example by pressing a button on device 101, speaking a command, activating a remote control, or by any other suitable means. The content is then viewed through transparent surface 102 by the baby or other individual situated beneath tray 100.

At any suitable time, the user can easily remove media device 101 from tray 100 by simply lifting it up out of tray 101. If appropriate, strap 104 or other restraining mechanism can be disengaged before removing device 101.

One advantage of the described apparatus is the ease with which the media device can be placed into the tray or removed from the tray. There is no need for the media device to be clipped, attached, or otherwise secured to the tray or to any other surface. However, in at least one embodiment, the described apparatus can also optionally provide additional mechanisms to further secure the media device within the tray These can include, for example, elastic strap(s), hook-and-loop fastener(s), adhesive fastener(s), magnet(s), tension clip(s), spring(s), and/or the like.

Advantages and Variations

The described apparatus allows an individual, such as a baby, to view content presented on media device 101 without having to hold or touch media device 101. The content is visible through tray 100, which may be transparent or may have a window to allow viewing of the display screen of device 101. Media device 101 is thus protected from damage that might otherwise be caused by allowing the baby (or other individual) to be able to grab or touch device 101, or by elements such as water or cooking splatter to come into contact with device 101.

In various embodiments, tray 100 can be constructed of clear plastic or any other transparent material, or a combination of transparent and non-transparent materials. For example, as described above in connection with FIG. 6, some portions of tray 100 may be constructed of wood, bamboo, cardboard, metal, or non-transparent plastic, while surface 102 can be made of plastic, glass, or some other transparent material. Alternatively, a window in surface 102 can be provided to allow for viewing of the display screen of media device 101 from below. The window can be an opening, or it can be a surface made of plastic, glass, or some other suitable material.

In at least one embodiment, the corners of the tray can be rounded so as to reduce the risk of injury.

In at least one embodiment, tray 100 may include a built-in charging station, allowing device 101 to be charged while it is in tray 100. For example, tray 100 may include wireless charging functionality. Alternatively, tray 100 may include a charging port that mates with a charging receptacle in device 101 when device 101 is situated in tray 100.

Figure 10:
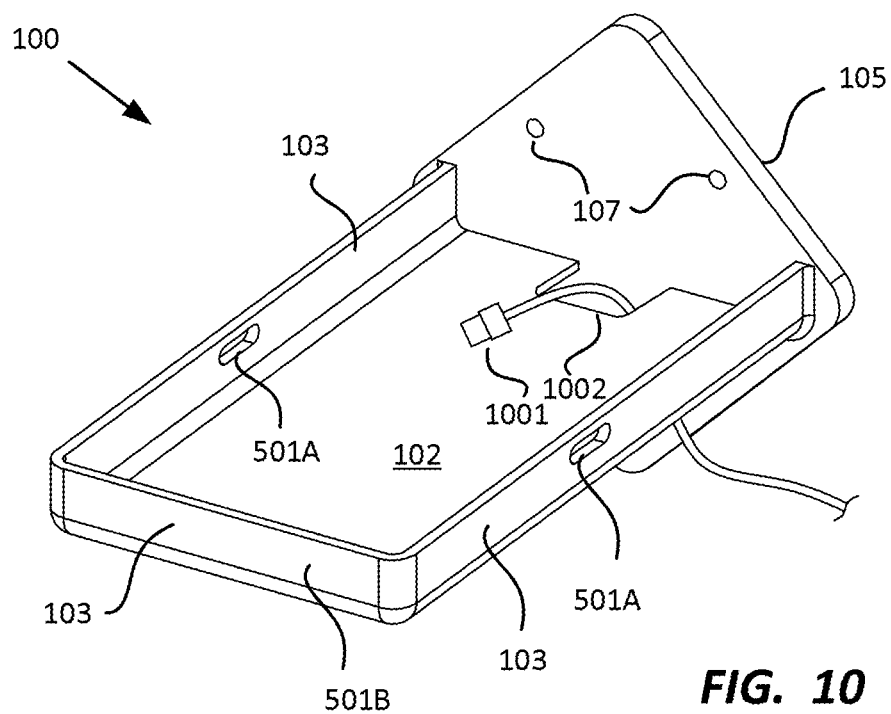
FIG. 10 is a perspective view of a tray including a charging cord, according to one embodiment.

Alternatively, as shown in the example of FIG. 10, a charging cord 1001 can be provided, that passes through an opening 1002 in surface 102 to be accessible to device 101 when device 101 is situated in tray 100. Clips, straps, and/or other organizing devices may be provided, so as to organize the orientation of a charging cord to maintain viewability of device 101 through surface 102.

Figure 7:
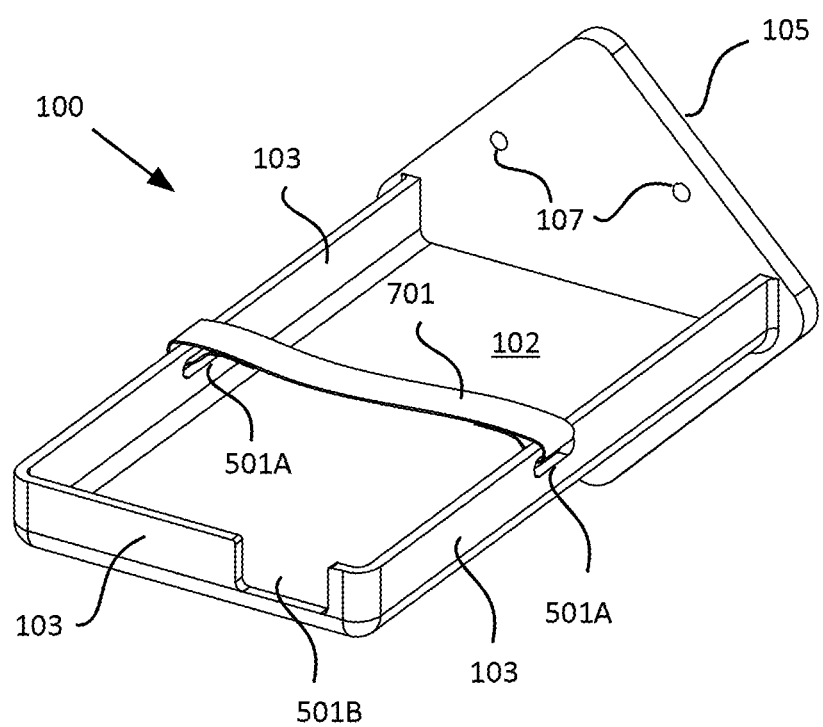
FIG. 7 is a perspective view of a tray including a hook-and-loop fastener, according to one embodiment.

In at least one embodiment, other types of electronic connections may be facilitated via tray 100. For example, ports and/or cords (wires) may be provided for connection to an external speaker or display device Referring now to FIG. 7 there is shown a perspective view of tray 100 including strap 701 containing a hook-and-loop fastener which can be used to secure device 101, according to one embodiment.

Figure 8:
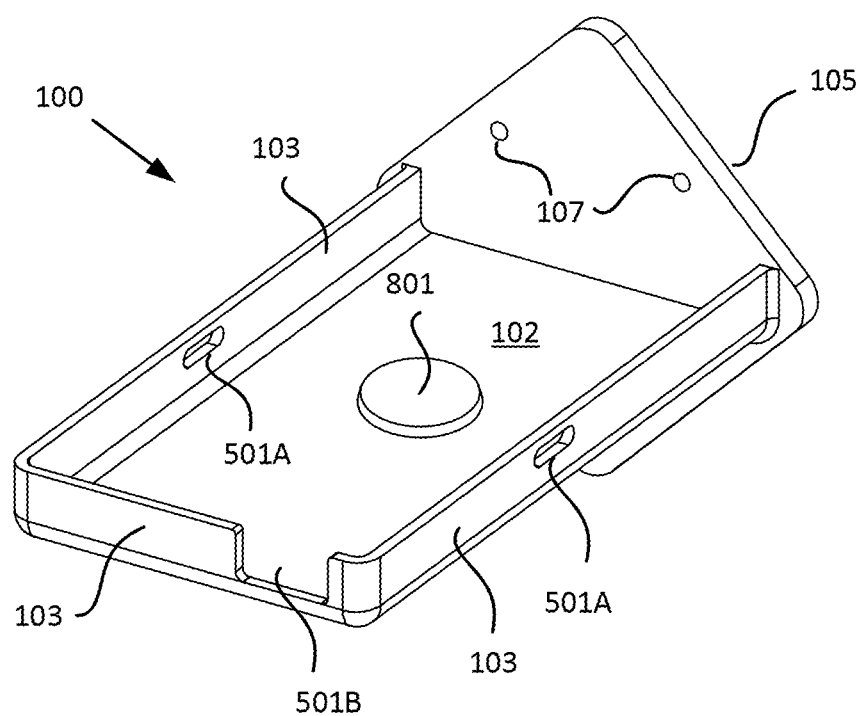
FIG. 8 is a perspective view of a tray including a magnet, according to one embodiment.
Figure 9:
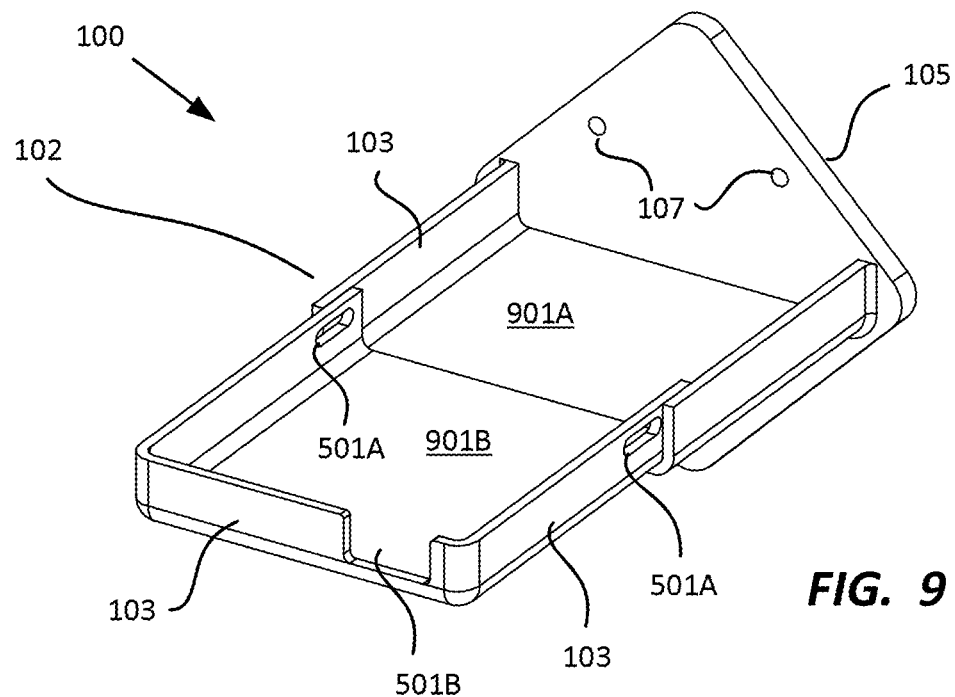
FIG. 9 is a perspective view of a tray including a mechanism for adjusting size, according to one embodiment.

Referring now to FIG. 8 there is shown a perspective view of tray 100 including magnet 801 which can be used to secure device 101, according to one embodiment.

Figure 11:
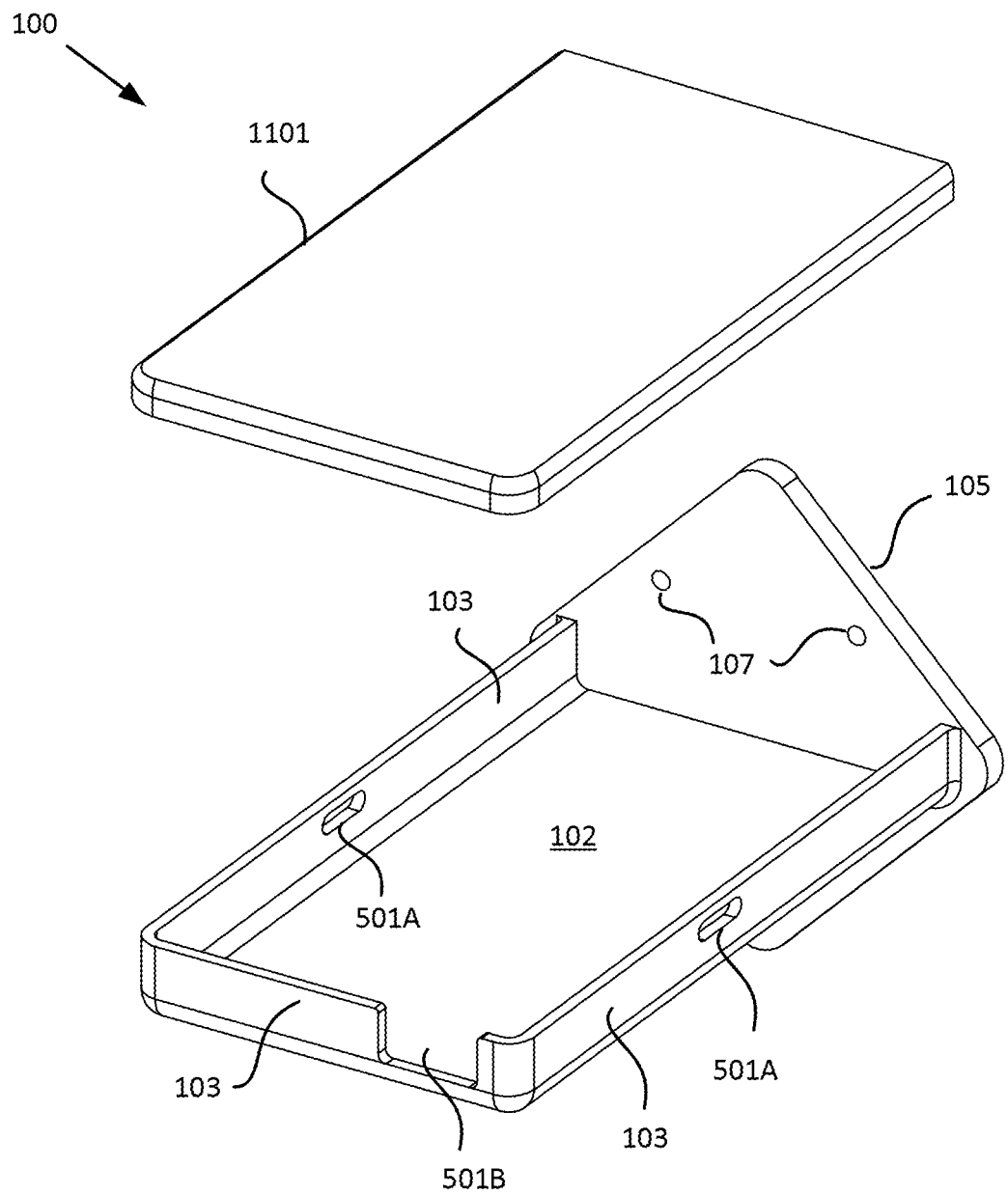
FIG. 11 is a perspective view of a tray including a removable lid, according to one embodiment.

Referring now to FIG. 11, there is shown a perspective view of tray 100 including removable lid 1101, according to one embodiment. In at least one embodiment, a lid 1101 can cover the back of media device 101 when it is situated on tray 100. The user can then place device 101 on tray 100 and snap lid 1101 closed, providing an even more secure enclosure for device 101. Lid 1101 can be held closed by any suitable means, such as a snap closure, magnet, clip, and/or the like. In at least one embodiment, lid 1101 may be waterproof, so as to provide protection from the environment, such as when viewing content on device 101 while showering or taking a bath.

The above description and referenced drawings set forth particular details with respect to possible embodiments. Those of skill in the art will appreciate that the techniques described herein may be practiced in other embodiments. First, the particular naming of the components or capitalization of terms is not mandatory or significant, and the mechanisms that implement the techniques described herein may have different names, formats, or protocols. Also, the particular division of functionality between the various system components described herein is merely exemplary, and not mandatory; functions performed by a single system component may instead be performed by multiple components, and functions performed by multiple components may instead be performed by a single component.

Reference in the specification to "one embodiment" or to "an embodiment" means that a particular feature, structure, or characteristic described in connection with the embodiments is included in at least one embodiment. The appearances of the phrase "in one embodiment" in various places in the specification are not necessarily all referring to the same embodiment.

While a limited number of embodiments has been described herein, those skilled in the art, having benefit of the above description, will appreciate that other embodiments may be devised which do not depart from the scope of the claims. In addition, it should be noted that the language used in the specification has been principally selected for readability and instructional purposes, and may not have been selected to delineate or circumscribe the inventive subject matter. Accordingly, the disclosure is intended to be illustrative, but not limiting.

What is claimed is:

1. A tray for holding a media device in a viewable position, comprising:
    a substantially flat transparent surface adapted to support the media device in a substantially facedown orientation, so that a display screen of the media device is viewable from below, through the transparent surface;
    at least one lip positioned proximate to at least one edge of the transparent surface; and
    a first securing mechanism, directly coupled to the transparent surface, adapted to secure the transparent surface to at least one of a supporting surface or object in a fixed, non-adjustable position;
    wherein the first securing mechanism comprises at least one selected from the group consisting of:
    at least one adhesive strip;
    at least one screw;
    at least one nail; and
    at least one clamp.

2. The tray of claim 1, further comprising a second securing mechanism to hold the media device in place while the media device is supported by the transparent surface.

3. The tray of claim 2, wherein the second securing mechanism comprises at least one selected from the group consisting of:
    at least one strap;
    at least one elastic strap;
    at least one clip;
    at least one restraining bar;
    at least one hook-and-loop fastener;
    at least one adhesive fastener;
    a lid;
    at least one magnet;
    at least one tension clip; and
    at least one spring.

4. The tray of claim 1, wherein the at least one lip comprises at least one cutout providing access to at least one of:
    a control on the media device;
    a port on the media device;
    a switch on the media device; and
    a button on the media device.

5. The tray of claim 1, wherein the substantially flat transparent surface is angled so as to support the media device at a fixed angle.

6. The tray of claim 5, wherein the fixed angle is a 45-degree angle.

7. The tray of claim 1, wherein the transparent surface is constructed from transparent plastic.

8. The tray of claim 1, wherein the transparent surface and the at least one lip are constructed from a single piece of transparent plastic.

9. The tray of claim 1, wherein the transparent surface is constructed from transparent plastic, and the at least one lip is constructed from a material other than transparent plastic.

10. The tray of claim 1, wherein the transparent surface comprises a window, and wherein the display screen of the media device is viewable from below, through the window.

11. The tray of claim 1, wherein the first securing mechanism is directly coupled to the transparent surface without an intervening supporting member.

12. A tray for holding a media device in a viewable position, comprising:
    a substantially flat transparent surface adapted to support the media device in a substantially facedown orientation, so that a display screen of the media device is viewable from below, through the transparent surface;
    at least one lip positioned proximate to at least one edge of the transparent surface;
    a first securing mechanism, coupled to the transparent surface, adapted to secure the transparent surface to at least one of a surface or object; and a charging mechanism adapted to charge the media device while the media device is being supported by the transparent surface.

13. A tray for holding a media device in a viewable position, comprising:
a substantially flat transparent surface adapted to support the media device in a substantially facedown orientation, so that a display screen of the media device is viewable from below, through the transparent surface;
at least one lip positioned proximate to at least one edge of the transparent surface;
a first securing mechanism, coupled to the transparent surface, adapted to secure the transparent surface to at least one of a surface or object; and
a mechanism for adjusting the size of the transparent surface.

14. A tray for holding a media device in a viewable position, comprising:
a substantially flat transparent surface adapted to support the media device in a substantially facedown orientation, so that a display screen of the media device is viewable from below, through the transparent surface;
at least one lip positioned proximate to at least one edge of the transparent surface;
a first securing mechanism, coupled to the transparent surface, adapted to secure the transparent surface to at least one of a surface or object; and
a removable lid configured to engage with the at least one lip when the media device is supported by the tray, thereby forming an enclosure for the media device.

15. The tray of claim 14, further comprising an adjustment mechanism for adjusting an orientation angle of the substantially flat transparent surface, so as to support the media device at an adjustable angle.

16. The tray of claim 14, wherein the first securing mechanism comprises a mechanism configured to allow the tray to be adjustably positioned while in use and selectively retracted while not in use.

17. The tray of claim 14, wherein the first securing mechanism comprises at least one selected from the group consisting of:
a hinge;
a gooseneck connector;
a repositionable arm; and
a telescoping connector.

18. The tray of claim 14, wherein the removable lid is waterproof when engaged with the at least one lip.

19. A method for using a tray to support a media device in a viewable position, comprising:
attaching a substantially flat transparent surface, in a fixed, non-adjustable position, to at least one of a supporting surface or object, wherein the transparent surface is adapted to support the media device and comprises at least one lip positioned proximate to at least one edge of the transparent surface;
placing the media device onto the transparent surface in a substantially facedown orientation, so that a display screen of the media device is viewable from below, through the transparent surface; and
using an adjustment mechanism to adjust the orientation angle of the substantially flat transparent surface, so as to support the media device at an adjustable angle.

20. A method for using a tray to support a media device in a viewable position, comprising:
attaching a substantially flat transparent surface, in a fixed, non-adjustable position, to at least one of a supporting surface or object, wherein the transparent surface is adapted to support the media device and comprises at least one lip positioned proximate to at least one edge of the transparent surface; and
placing the media device onto the transparent surface in a substantially facedown orientation, so that a display screen of the media device is viewable from below, through the transparent surface;
wherein attaching the substantially flat transparent surface to the at least one of the surface or object comprises attaching the substantially flat transparent surface using at least one selected from the group consisting of:
at least one adhesive strip;
at least one screw;
at least one nail; and
at least one clamp.

21. The method of claim 20, further comprising engaging a securing mechanism to hold the media device in place while the media device is supported by the transparent surface.

22. The method of claim 21, wherein the securing mechanism comprises at least one selected from the group consisting of:
at least one strap;
at least one elastic strap;
at least one clip;
at least one restraining bar;
at least one hook-and-loop fastener;
at least one adhesive fastener;
a lid;
at least one magnet;
at least one tension clip; and
at least one spring.

23. The method of claim 20, wherein the at least one lip comprises at least one cutout providing access to at least one of:
a control on the media device;
a port on the media device;
a switch on the media device; and
a button on the media device.

24. The method of claim 20, wherein the substantially flat transparent surface is angled so as to support the media device at a fixed angle.

25. The method of claim 24, wherein the fixed angle is a 45-degree angle.

26. The method of claim 20, wherein attaching the substantially flat transparent surface to the at least one of a supporting surface or object comprises directly coupling the transparent surface to the at least one of a supporting surface or object, without an intervening supporting member.

27. A method for using a tray to support a media device in a viewable position, comprising:
attaching a substantially flat transparent surface, adapted to support the media device, to at least one of a surface or object, wherein the surface comprises at least one lip positioned proximate to at least one edge of the transparent surface;
placing the media device onto the transparent surface in a substantially facedown orientation, so that a display screen of the media device is viewable from below, through the transparent surface; and
connecting a charging mechanism to charge the media device while the media device is being supported by the transparent surface.

28. A method for using a tray to support a media device in a viewable position, comprising:
attaching a substantially flat transparent surface, adapted to support the media device, to at least one of a surface or object, wherein the surface comprises at least one lip positioned proximate to at least one edge of the transparent surface;

placing the media device onto the transparent surface in a substantially facedown orientation, so that a display screen of the media device is viewable from below, through the transparent surface; and adjusting the size of the transparent surface.

29. A method for using a tray to support a media device in a viewable position, comprising:

attaching a substantially flat transparent surface, adapted to support the media device, to at least one of a surface or object, wherein the surface comprises at least one lip positioned proximate to at least one edge of the transparent surface;

placing the media device onto the transparent surface in a substantially facedown orientation, so that a display screen of the media device is viewable from below, through the transparent surface; and subsequent to placing the media device onto the transparent surface, engaging a removable lid with the at least one lip, thereby forming an enclosure for the media device.

30. The method of claim 29, wherein attaching the substantially flat transparent surface to the at least one of the surface or object comprises attaching the substantially flat transparent surface using a mechanism configured to allow the tray to be adjustably positioned while in use and selectively retracted while not in use.

31. The method of claim 29, wherein attaching the substantially flat transparent surface to the at least one of the surface or object comprises attaching the substantially flat transparent surface using at least one selected from the group consisting of:
- a hinge;
- a gooseneck connector;
- a repositionable arm; and
- a telescoping connector.

32. The method of claim 29, wherein the removable lid is waterproof when engaged with the at least one lip.

33. A tray for holding a media device in a viewable position, comprising:

a substantially flat transparent surface adapted to support the media device in a substantially facedown orientation, so that a display screen of the media device is viewable from below, through the transparent surface;

at least one lip positioned proximate to at least one edge of the transparent surface; and a first securing mechanism, directly coupled to the transparent surface, adapted to secure the transparent surface to a wall in a fixed, non-adjustable position.

34. A method for using a tray to support a media device in a viewable position, comprising:

attaching a substantially flat transparent surface, in a fixed, non-adjustable position, to a wall, wherein the transparent surface is adapted to support the media device and comprises at least one lip positioned proximate to at least one edge of the transparent surface; and placing the media device onto the transparent surface in a substantially facedown orientation, so that a display screen of the media device is viewable from below, through the transparent surface.

* * * * *